(12) United States Patent
Kajita

(10) Patent No.: US 6,687,280 B1
(45) Date of Patent: *Feb. 3, 2004

(54) VERTICAL-CAVITY SURFACE-EMITTING LASER DEVICE

(75) Inventor: Mikihiro Kajita, Tokyo (JP)

(73) Assignee: NEC Corporation, Tokyo (JP)

( * ) Notice: This patent issued on a continued prosecution application filed under 37 CFR 1.53(d), and is subject to the twenty year patent term provisions of 35 U.S.C. 154(a)(2).

Subject to any disclaimer, the term of this patent is extended or adjusted under 35 U.S.C. 154(b) by 0 days.

(21) Appl. No.: 09/217,851

(22) Filed: Dec. 21, 1998

(30) Foreign Application Priority Data

Dec. 24, 1997 (JP) .............................. 9-355453

(51) Int. Cl.⁷ ................................ H01S 3/08
(52) U.S. Cl. ...................... 372/96; 372/50; 372/75
(58) Field of Search ................. 372/96, 50, 75

(56) References Cited

U.S. PATENT DOCUMENTS 5,119,393 A * 6/1992 Oka et al. .................... 372/96
5,164,949 A * 11/1992 Ackley et al. ................ 372/45
5,563,902 A * 10/1996 Xu et al. ...................... 372/50
5,732,102 A * 3/1998 Bouadma .................... 372/96
5,796,771 A * 8/1998 DenBaars et al. ........... 372/75
6,154,480 A * 11/2000 Magnusson et al. ........ 372/96

FOREIGN PATENT DOCUMENTS

| JP | 7-245449 | 9/1995 |
| JP | 7-249824 | 9/1995 |
| JP | 9-8413   | 1/1997 |

* cited by examiner

Primary Examiner—Paul Ip
Assistant Examiner—Cornelius H Jackson
(74) Attorney, Agent, or Firm—Sughrue Mion, PLLC

(57) ABSTRACT

This invention provides a vertical-cavity surface-emitting laser device comprising a surface light-emitting part comprising a cavity consisting of two multilayer reflectors and an active region between them and a waveguide part for introducing induced light into the surface light-emitting part. The device is substantially independent of a temperature and allows a wavelength to be controlled after manufacturing the device.

5 Claims, 7 Drawing Sheets

VERTICAL-CAVITY SURFACE-EMITTING LASER DEVICE

BACKGROUND OF THE INVENTION

1. Field of the Invention

This invention relates to a vertical-cavity surface-emitting laser device, and in particular relates to a vertical-cavity surface-emitting laser device which is substantially independent of a temperature and can emit at oscillation wavelength as we like. This invention also relates to a process for fabricating the vertical-cavity surface-emitting laser device and a lasing process. In addition, this invention relates to a vertical-cavity surface-emitting laser device capable of multi-wavelength lasing and a multi-wavelength lasing process. Furthermore, this invention relates to an optical communication system employing the vertical-cavity surface-emitting laser device.

2. Description of the Related Art

In the field of data communication, a data rate has been rapidly increased, and data throughput and bandwidth have been enlarged. Thus, much attention has been attracted to optical communication, and this technique has been employed. Using light may eliminate influence of electromagnetic-wave noises such as EMI from a cable, leading to large-capacity transmission with a light-weight cable. Recently, some optical-module products have been available for Fiber Channel (1.0625 Gbps) and Gigabit Ethernet (1.25 Gbps).

For high-speed and large-capacity transmission, a wavelength division multiplex (WDM) technique has been developed. A vertical-cavity surface-emitting laser (VCSEL) has been developed as a low-cost light source for high-speed data link and incorporated in the above optical modules. Features of VCSELs are as follows.

1) VCSELs are low-cost devices, because they allow some on-wafer tests and a cleavage for forming mirror edges is not required.
2) VCSELs have a small light beam divergence, which allows a high coupling efficiency with optical fibers.
3) VCSELs have a higher reliability than CD lasers.

One of the properties required as a light source is a good temperature characteristic. Specifically, if its performance significantly depends on a temperature (typically, a higher temperature deteriorates its performance), power consumption may be increased, which may accelerate deterioration, even when an automated power control (APC) is employed for a constant light output.

In edge-emitting lasers, such characteristic deterioration with an increase in temperature can rarely be prevented, and attempts have been made to reduce such deterioration.

To obtain good temperature characteristics, in the prior art for VCSELs, a gain peak is set to a shorter wavelength side than a cavity-resonant peak (gain offset) to allow these two peaks to overlap as temperature rises and thus to prevent characteristic deterioration (the gain peak and the cavity-resonant peak are shifted to a longer wavelength direction at a rate of about 0.3 nm/° C. and about 0.07 nm/° C., respectively). D. B. Young et al. have detailed such a technique in *IEEE Journal of Quantum Electronics*, Vol.29, 2013–2022 (1993). Alternatively, there is an attempt made that the wavelength of gain peaks for each of quantum wells in active layers differs from each other to increase a net gain bandwidth for providing a constant gain in a wide temperature range. The technique has been described in M. Kajita et al., *IEEE Journal of Selected Topics in Quantum Electronics*, Vol.1, pp.654–660 (1995) or JP-A 7-245449.

According to the above gain offset method, within the range shown in FIG. 8, a threshold current of a device can remain low for VCSELs. Note that a threshold current may increase as a temperature rises, for edge-emitting lasers.

These techniques, however, require precise control during wafer growth, and thus a yield is not always satisfactory.

Thus, in JP-A9-8413, the present inventor has suggested a process for manufacturing a VCSEL where active layers are grown at a low temperature to avoid deviation of a gain offset from a designed value due to, for example, film-thickness distribution and flux drift inevitable during the growing step, and after growing, data on cavity-resonant and gain peaks are obtained, based on which the device is heated at a selected temperature to achieve a desired offset between the two peaks and thus to consistently ensure excellent designed characteristics.

As described above, the VCSEL thus obtained may have constant characteristics in some wide temperature range. However, since the designed range cannot be altered, characteristic deterioration is inevitable beyond the range. Thus, in the prior art, a light intensity can be controlled, while a wavelength is controlled only by adjustment during a manufacturing process, but not after the process.

SUMMARY OF THE INVENTION

An objective of this invention is to provide a VCSEL substantially independent of a temperature.

Another objective of this invention is to provide a VCSEL whose wavelength can be controlled after manufacturing thereof.

Another objective of this invention is to provide a lasing process, in particular a multiwavelength lasing process, using the VCSEL.

The above objectives can be achieved by a VCSEL of this invention comprising a surface light-emitting part comprising a resonator consisting of two multilayer reflectors and active layers inserted between two reflectors; and a waveguide part for introducing induced light near the surface light-emitting part.

The VCSEL can be produced by a process comprising sequentially depositing at least an n-type multilayer reflector, an n-type intermediate layer, an active layer, a p-type intermediate layer and a p-type multilayer reflector on a substrate;

etching the p-type multilayer reflector to form a mesa structure for a surface light-emitting part, and etching a predetermined region to form a mesa structure for a waveguide part;

forming p-type electrodes on the mesa structures of the surface light-emitting part and of the waveguide part;

forming a high-resistive region; and forming an n-type electrode on the back of the substrate.

For a lasing process using the VCSEL, the cavity-resonant peak is preset, at a given temperature, to a longer wavelength than the gain peak, and an applied voltage is adjusted to make the gain peak be aligned with the cavity-resonant peak when induced light generated by applying the voltage to the waveguide part is introduced to the surface light-emitting part.

Multiwavelength oscillation using the VCSEL can be achieved by presetting the cavity-resonant peak, at a given temperature, to a longer wavelength than the gain peak, adjusting a voltage applied to the waveguide part so that the gain peak be aligned with the cavity-resonant peak by induced light generated at the waveguide part into the surface light-emitting part, for laser oscillation at one wavelength; then altering the device temperature to shift the cavity-resonant peak; and again adjusting the applied voltage to shift the gain peak to be aligned with the cavity-resonant peak, for laser oscillation at a different wavelength from the previous wavelength.

Furthermore, this invention provides an optical communication system comprising at least a transmission part, a corresponding receiving part and a light transmission means connecting between them, characterized in that the above VCSEL is used as a light source for the transmission part to allow the single light source to emit one or more wavelength lights, and the light transmission means connects the single transmission part with one or more receiving parts.

According to this invention, a light source for an optical data link substantially independent of a temperature can be manufactured, which eliminates corrective actions such as temperature control even under conditions involving temperature rising inside of an apparatus such as computers. Specifically, temperature dependent factors may include a light output intensity and a wavelength. The light output intensity has been well controlled by the prior art, while a wavelength cannot be adequately controlled. There may be no needs for wavelength control in current replacement of a module with a single-wavelength. Wavelength control is, however, essential for coping with a future multiwavelength communication such as WDM. Such wavelength control can be performed after manufacturing the VCSEL, to improve a yield. Wavelength control can be precisely made during operation, which permits the VCSEL to be used for WDM applications.

A waveguide manufactured according to this invention does not alter a general process for manufacturing a VCSEL, and does not adversely affect a yield or assembly of the VCSEL.

DETAILED DESCRIPTION OF THE PREFERRED EMBODIMENTS

In future, wavelength control will become essential in applications associated with WDM applications. In the light of realizing such a technique as well as control during manufacturing and operation, control by means of adding a function according to this invention will be essential. Forming a waveguide part according to this invention does not affect a cost for manufacturing a vertical-cavity surface-emitting laser device, a yield or assembly as an optical part. Therefore, it does not have a significant disadvantage.

Figure 1A:
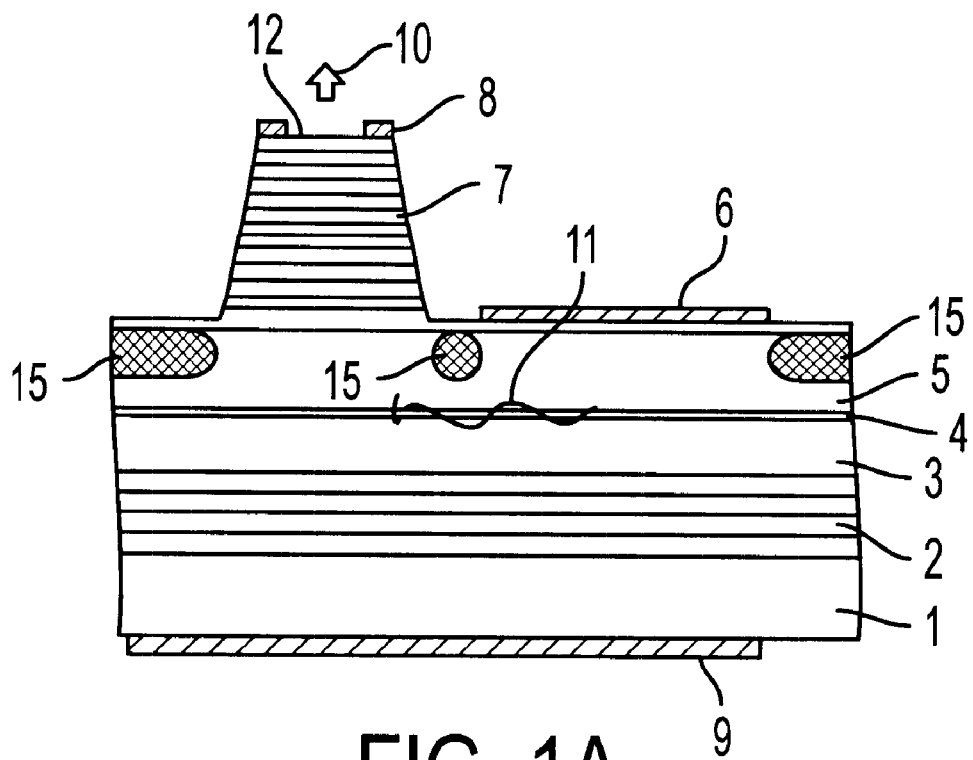
FIG. 1 is a schematic view of an embodiment of the VCSEL of this invention, in which (a) is a cross section and (b) is a plan view.
Figure 1B:
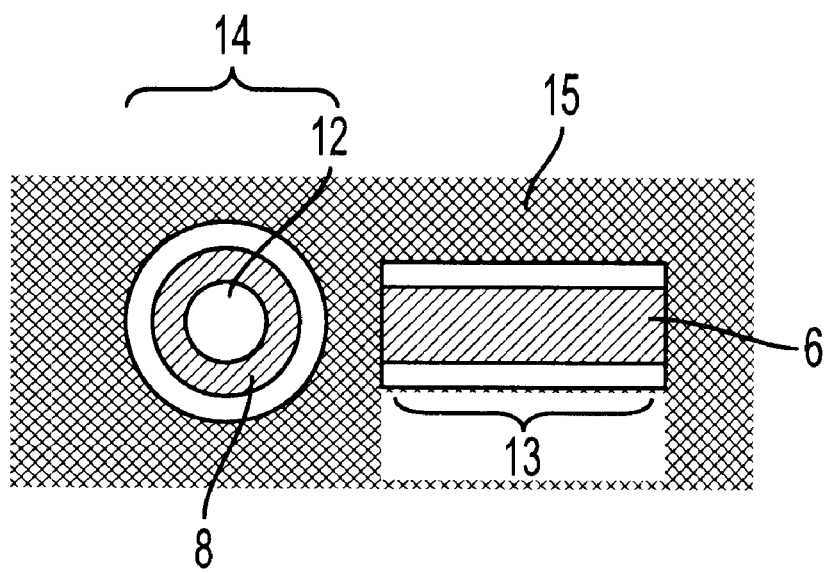

As shown in FIG. 1, this invention is characterized in the edge-emitting type of waveguide formed near the vertical-cavity surface-emitting laser (VCSEL). Current injection into the edge-emitting type of waveguide may be altered to change the gain shape in the active layers of the VCSEL and thus to shift the peak so as to be aligned with the cavity-resonant peak. This procedure is not entirely dependent on precise control during wafer growth and allows the wavelength to be controlled later, i.e., after manufacturing the device. The device of this invention can be, therefore, manufactured in an improved yield, which allows an oscillation wavelength to be controlled, and be used in WDM applications.

This invention will be specifically described by referring to the accompanying drawings.

EXAMPLE 1

As shown in Fig.1, a waveguide part 13 is formed near a surface light-emitting part 14. On a substrate 1 are formed an n-type DBR (Distributed Bragg Reflector) 2 as an n-type multilayer reflector, an n-type spacer layer 3 as an n-type intermediate layer, active layers 4, a p-type spacer layer as a p-type intermediate layer and a p-type DBR 7 as a p-type multilayer reflector. A waveguide electrode 6 and a ring electrode 8 are formed as p-type electrodes, and on the back of the substrate 1, an n-type electrode 9 is formed as a common electrode. The waveguide part 13 is etched into a mesa structure for confining light, on which an electrode 6 is formed. A mesa part is also formed on the surface light-emitting part 14 by etching, and for a surface-emitting laser the ring electrode 8 is formed as shown in the figure.

The mesa structures may be formed by an RIBE (reactive ion beam etching) technique using chlorine gas. The surface light-emitting part and the waveguide part are high-resistive regions, which allow the effective current injection into the active layers. Current injection into the waveguide electrode 6 generates induced light 11 in the waveguide part 13. The induced light enters the surface light-emitting part 14 leading to change in a gain spectrurm. The extent of the change depends on the wavelength and the intensity of the induced light 11. Thus, the gain spectrum may be also controlled by changing the intensity. The intensity of the induced light 11 may be controlled by the applied voltage to the electrode 6.

A laser beam can be emitted from the bottom of the device in contrast with FIG. 1. In such a case, since a laser light is output through the substrate, an available wavelength range may be somewhat restricted depending on the substrate material. When the beam is emitted from the bottom of the device, the ring electrode 8 in FIG. 1 may be replaced with a circular electrode to cover a laser emitting part 12 and a hole may be formed for laser-beam emission in the electrode 9 on the bottom of the device.

Examples of materials which may be used are as follows; for the substrate 1, Si-doped GaAs; for the n-type DBR 2, Si-doped GaAs and Si-doped AlAs in which these materials with a thickness of ¼λ (λ is an oscillation wavelength) are alternately laminated by, e.g., 24 cycles; for the n-type spacer layer 3, Si-doped AlGaAs in which the composition ratio of Al is, for example, 0.5; for the active layer 4, undoped InGaAs in which the composition ratio of In is, for example, 0.2 and whose thickness is, for example, about 30 nm; for the p-type spacer layer 5, Be-doped AlGaAs in which the composition ratio of Al is, for example, 0.5 and whose thickness is ½λ; for The p-type DBR 7, Be-doped GaAs and Be-doped AlAs in which these materials with a thickness of ¼λ are alternately laminated by, e.g, 20 cycles. The higher-resistance region 15 is formed by proton implantation with, for example, a dose of $5\times10^{14}$ cm$^{-2}$ and an implantation energy of 85 keV. The p-type ring electrode 8 and the p-type waveguide electrode 6 are alloyed with Ti/Pt/Au. The n-type electrode 9 is alloyed with AuGe/Ni/Au. For example, the mesa size for the surface light-emitting part 14 is 15 μmø, and the mesa structure for the waveguide part 13 has a width of 10 μm and a length of 100 μm.

Figure 2A:
FIG. 2 is a cross-sectional process view illustrating a manufacturing process for the VCSEL of this invention.
Figure 2B:
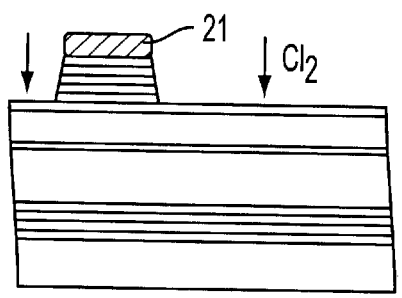

The manufacturing process for the device of this invention will be described. A wafer in which various layers to the p-type DBR 7 are deposited on the substrate as shown in FIG. 2(a), is prepared by means of a MBE (molecular beam epitaxy) or MOCVD (metal-organic chemical vapor deposition) technique. After lithography using a photoresist 21 as a mask, mesas for the surface light-emitting part (FIG. 2(b)) and for the waveguide part (FIG. 2(c)) are formed by etching. A p-type electrode is then formed by lift-off technique. Using these electrodes as a mask, hydrogen ions (protons) are implanted to form a high-resistive region. Vacuum evaporation may be conducted in a usual vacuum evaporator. Then, an n-type electrode is formed on the back of the substrate by vapor evaporation (FIG. 2(d)). The exposed layer on the laser emitting part 12 must be a GaAs layer. In the exposed part, a Be-doping level is set to be relatively higher, e.g., $1\times10^{20}$ cm$^{-3}$. Such a higher doping level may be sufficient to eliminate influence of ion injection for preventing a crystalline structure from being broken and thus for preventing a resistance increase in the part.

The device may be more effective by making the waveguide part and the surface light-emitting part closer. However, since the electrodes of the two parts must be separated from each other, they are formed as close as possible within the restriction. As the distance is increased, the intensity of the light induced in the waveguide part and introduced into the active layers of the surface light-emitting part is gradually reduced, which requires a higher voltage applied to the waveguide part. In practice, the distance between the waveguide part and the surface light-emitting part may be, therefore, preferably up to 10 μm, more preferably up to 5 μm. The high-resistive region formed by ion implantation electrically insulates the waveguide part from the surface light-emitting part. It may be, therefore, desirable to inject ions in a manner that they do not reach the active layers, as shown in FIG. 1. When the implanted ions reach the active region, it may be preferable that ions are implanted using a mask between the surface light-emitting part and the waveguide part, without forming a high-resistive region. In such a case, the surface light-emitting part and the waveguide part are electrically separated from each other, if a doping level in the top GaAs layer of the DBR may be restricted to about $3\times10^{18}$ cm$^{-3}$.

Figure 3A:
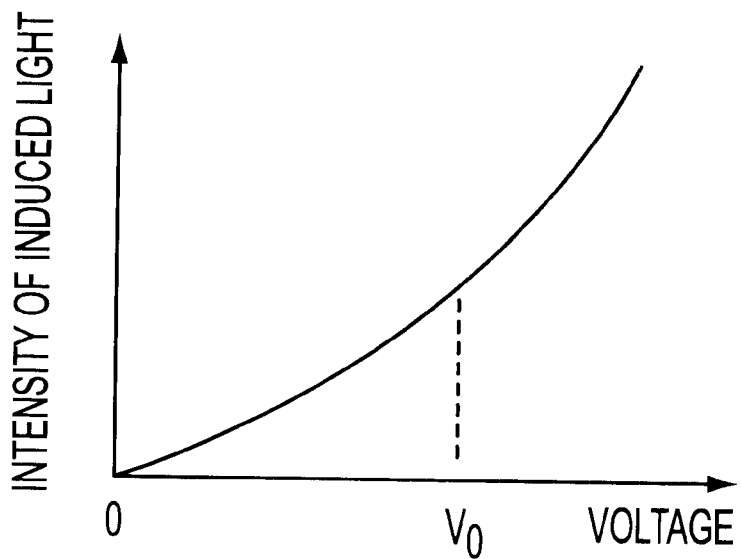
FIG. 3 illustrates a gain control principle in this invention, in which (a) shows a relationship of induced light intensity with an applied voltage to the waveguide part and (b) shows a gain peak (a broken line) without an applied voltage to the waveguide part and a gain-peak with a given voltage applied to the waveguide part (a solid line).
Figure 3B:
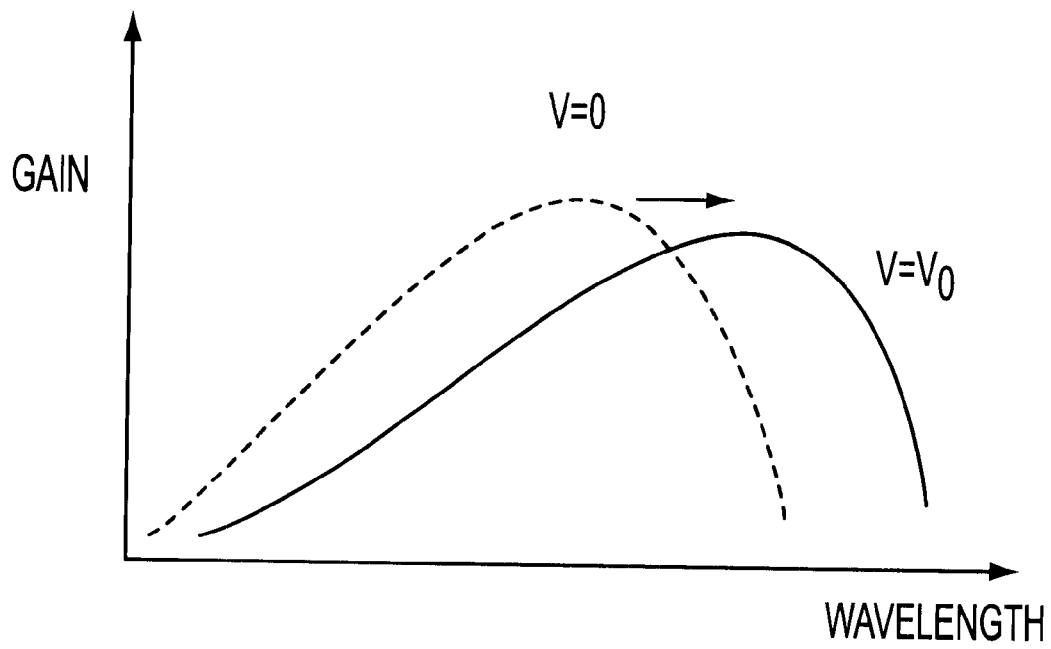
Figure 4A:
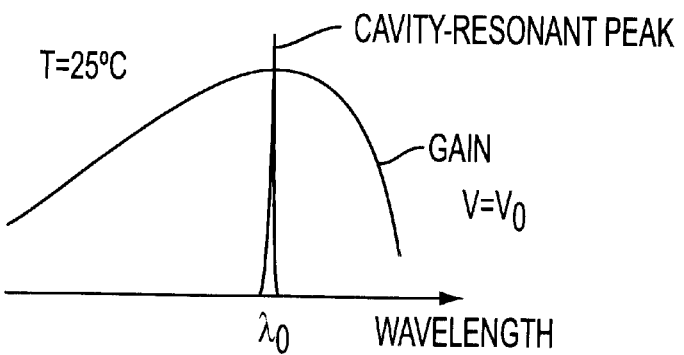
FIG. 4 shows a relationship between the cavity-resonant and gain peaks in the VCSEL of this invention, in which (a) shows overlap of the cavity-resonant peak with the gain peak at room temperature (25° C.), (b) shows a shift difference between the cavity-resonant and the gain peaks at a higher temperature (100° C.), and (c) shows re-overlap of the gain peak and the cavity-resonant peak which have been separated in (b).
Figure 4B:
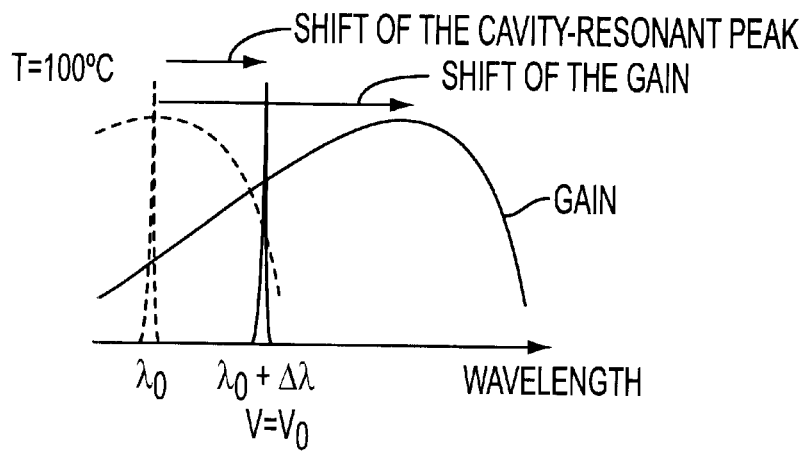
Figure 4C:
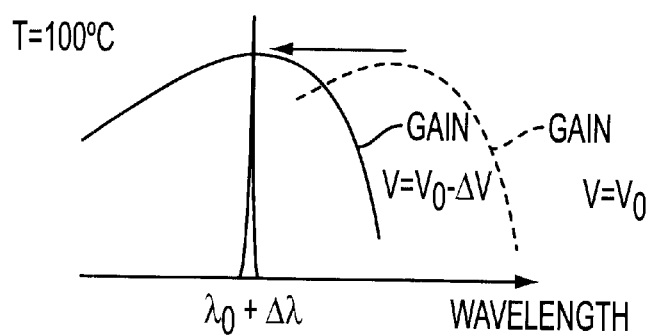

Operations of the device will be described. An appropriate voltage is applied to the waveguide electrode 6 to generate the induced light 11 in the waveguide part 13, while in the surface light-emitting part 14 laser oscillation has already been started as shown in FIG. 3(b). Then, the induced light 11 may be introduced from the waveguide part 13 into the surface light-emitting part 14, to alter the gain spectrum of the part 14 as shown in FIG. 3(c). As the applied voltage is increased, the intensity of the induced light increases as shown in FIG. 3(a), and thus, the density of the carriers excited by the induced light and entering the active layers of the surface light-emitting part 14 is increased, leading to change in the gain spectrum. As a temperature rises, the gain peak is gradually shifted to the longer wavelength side. Thus, while setting the cavity-resonant peak of the surface light-emitting part 14 at a longer wavelength than the peak gain, a relatively strong induced light 11 is initially (at room temperature) introduced, i.e., a higher voltage is applied, to significantly shift the gain peak to the longer wavelength side so as to be aligned with the cavity-resonant peak (FIG. 4(a)). Thus, at room temperature the gain peak is aligned with the cavity-resonant peak, giving good characteristics. At a higher temperature (in this figure, 100° C.), the gain peak is a shifted more than the cavity-resonant peak, so that the gain peak is positioned at a longer wavelength than that of the cavity-resonant peak, to cause misalignment of these peaks (FIG. 4(b)). Thus, the induced light which has been initially stronger is made weaker by reducing the voltage applied to the wavelength part. Then, apparently the gain peak is not shifted very much, and therefore, the shift can be adjusted to be the same wavelength as the cavity-resonant peak (FIG. 4(c)). In other words, even at a higher temperature, both peaks can be aligned with each other. Consequently, the best characteristics can be consistently obtained, substantially without deterioration.

The above description is based on room temperature, but the base temperature is not restricted to it and can be selected depending on desired conditions as appropriate. In contrast with the example where adjustment to temperature rising has been described, a higher temperature may be selected as a base temperature and a voltage applied to the waveguide part may be increased during lowering the temperature.

The voltage applied to the waveguide part may vary depending on the shape of the waveguide part and also a required intensity of the induced light. Therefore, it may not be specifically limited, but in general higher than about 0 V and less than 5 V. Meanwhile, the voltage applied to the surface light-emitting part may be any value higher than a threshold depending on the material used; for example about 5 V for the above example.

EXAMPLE 2

Figure 2C:
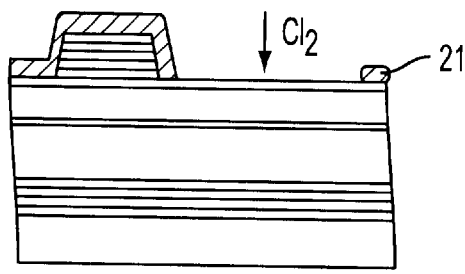
Figure 2D:
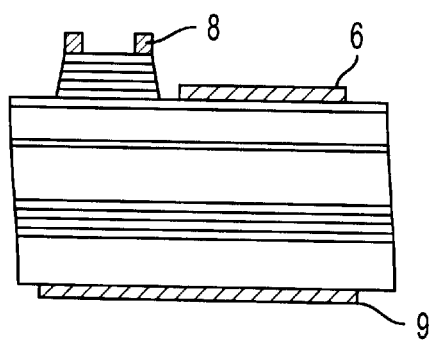
Figure 5:
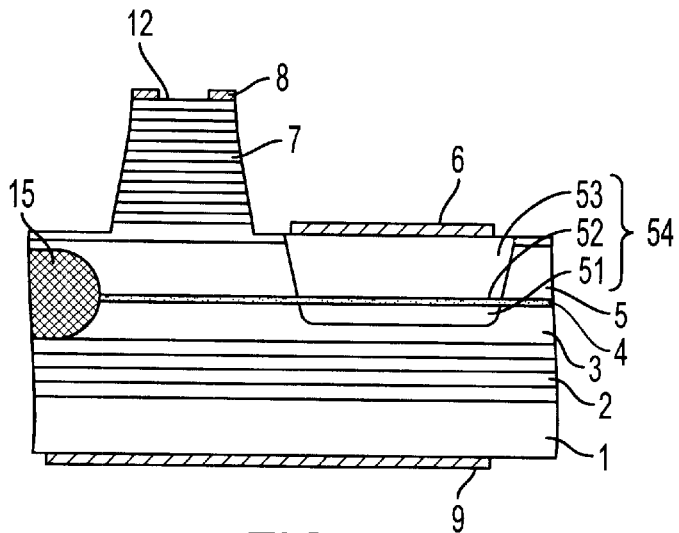
FIG. 5 is a schematic cross section of another embodiment of the VCSEL of this invention.
Figure 6A:
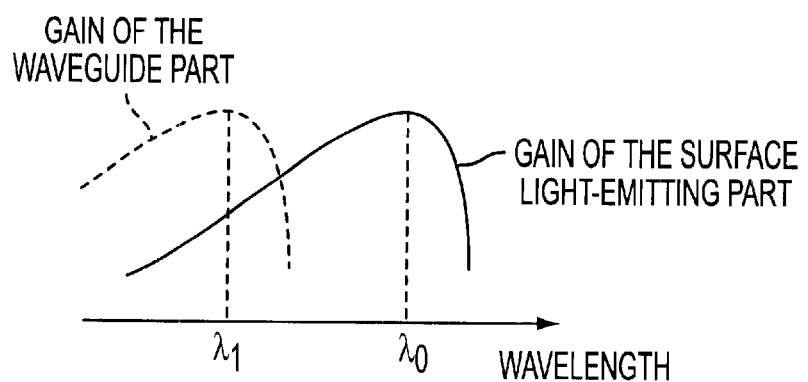
FIG. 6 shows a gain peak of the VCSEL in FIG. 5, in which (a) shows gain peaks in the active region of the surface light-emitting part and the waveguide part, and (b) shows an apparent gain peak of the surface light-emitting part as a combination of the two peaks.
Figure 6B:
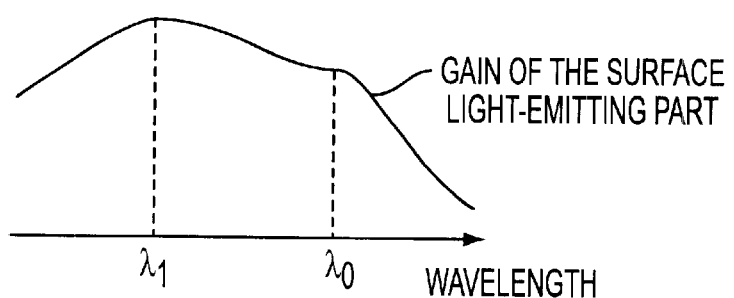

In Example 1, the waveguide part and the surface light-emitting part continuously share a single active region. Alternatively, as shown in FIG. 5, the surface light-emitting part may be formed first, and then the waveguide part, such as an n-type spacer layer 51, active layers 52 and a p-type spacer layer 53 in the waveguide region, may be fabricated by using MBE regrowth technique. This may lead to provide active layers with a different InGaAs composition from that for the surface light-emitting part. Specifically, after the step in FIG. 2(b), the region to be a waveguide part is etched, active layers different from those for a surface light-emitting parts are formed, and then the region is etched to form a mesa structure as a waveguide, as shown in FIG. 2(c). Thus, the gain peak of InGaAs in the waveguide part may be preset to a shorter wavelength side ($\lambda_1$) than that of the surface light-emitting part ($\lambda_0$), as shown in FIG. 6(a), whereby the apparent peak of the waveguide part comes to be at $\lambda_1$ (FIG. 6(b)). Then, a voltage applied to the waveguide electrode may be increased to achieve effects similar to those in Example 1.

In Examples 1 and 2, an oscillation wavelength of the surface light-emitting part varies as temperature changes. Utilizing the phenomenon, the oscillation wavelength of the surface light-emitting part may be controlled. Specifically, it may be achieved by presetting the cavity-resonant peak of the VSCEL, at a given temperature, to a longer wavelength than the gain peak of the VSCEL. Then, the gain peak can be aligned with the cavity-resonant peak when induced light generated by applying the voltage to the waveguide part is introduced to the surface light-emitting part, for oscillation at one wavelength. Other preferred methods include actively altering the device temperature to shift the cavity-resonant peak; and again adjusting the voltage applied to the waveguide part to shift the gain peak of the VSCEL to be aligned with the cavity-resonant peak, for oscillation at a different wavelength from the previous wavelength.

Since a single material has a gain bandwidth of about 25 nm, an available oscillation wavelength may be at least within this bandwidth. This invention can further utilize temperature change. Specifically, since the above gain peak varies at about 0.3 nm/° C., the wavelength can be precisely controlled in a range of about 28 nm with a temperature range of 100° C. By the way, a wavelength bandwidth required for WDM applications is substantially a bandwidth of a fiber amplifier, which is currently about 26 nm, i.e., 32 wavelengths in 0.8 nm intervals or 16 wavelengths in 1.6 nm intervals. Therefore, this invention can satisfactorily cope with it.

EXAMPLE 3

Figure 7:
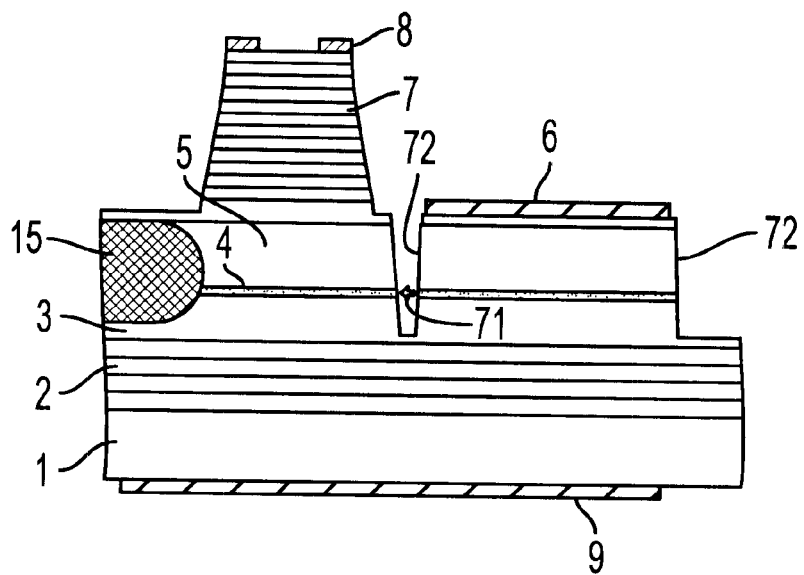
FIG. 7 is a schematic cross section of another embodiment of the VCSEL of this invention.
Figure 8:
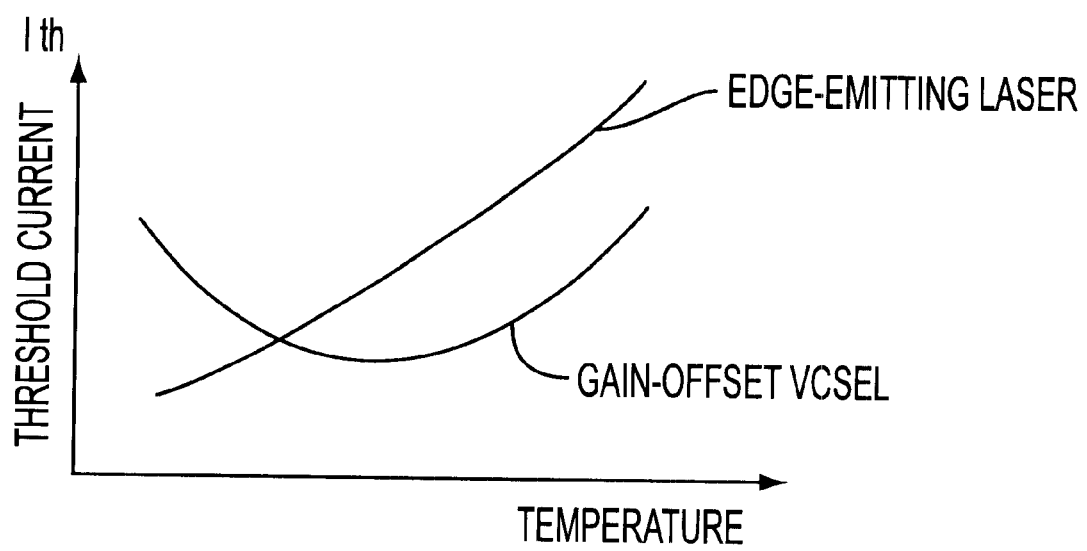
FIG. 8 shows temperature dependency of threshold currents of an edge-emitting laser and of a gain-offset VCSEL according to the prior art.

In the VCSEL obtained in Example 1 or 2, the surface light-emitting part and the waveguide part may be separated by etching, and the mirrors 72 of the edge-emitting waveguide may be formed as shown in FIG. 7 to allow the waveguide part to act as an edge-emitting laser. Thus, the mesa of the waveguide part may be formed with a length as long as about 1 mm for a high power output, whereby photoexcitation using a laser beam 71 from the waveguide part may cause emission from the surface light-emitting part. This may be advantageous because of a reduction in resistance at the operation due to current injection into the waveguide part, while a VCSEL generally exhibits a high resistance.

There are no limitations for the width of the groove between the surface light-emitting part and the waveguide part as long as it is ensured that an induced light from the waveguide part with a desired intensity enters the active layers of the surface light-emitting part. However, considering the induced light emitted from the edge of the waveguide part may be reduced when the groove is excessively wide, it may be generally up to 10 $\mu$m, preferably up to 5 $\mu$m. Its lower limit may not be defined as long as edge mirrors can be formed, and may be determined of itself by a processing limit during etching.

A material of each layer may be selected to provide a desired wavelength as appropriate, and may not be limited to that described in the above example. For example, the above AlGaAs material can allow oscillation with a wavelength bandwidth of about 0.98 $\mu$m; about 0.85 $\mu$m for the same material in which as the active layer part InGaAs is replaced with GaAs; and about 1.3 $\mu$m for an InGaAsP material. The composition may be also selected as appropriate. The size described is also illustrative, but does not limit this invention. The above processes for forming individual layers and the etching process are also illustrative.

A plurality of waveguide parts may be formed around the surface light-emitting part to shift the gain peak much more. Each of the waveguide parts may have an electrode or they may have a common electrode if they have the same resistance. In the first embodiment, the laser emitting part 12 was not protected during ion implantation, but it may be covered with a dielectric film such as SiN or a photoresist, which is then removed after ion implantation.

EXAMPLE 4

There will be described an example in which a VCSEL of this invention is used in a wavelength division multiplex (WDM) system.

Figure 9:
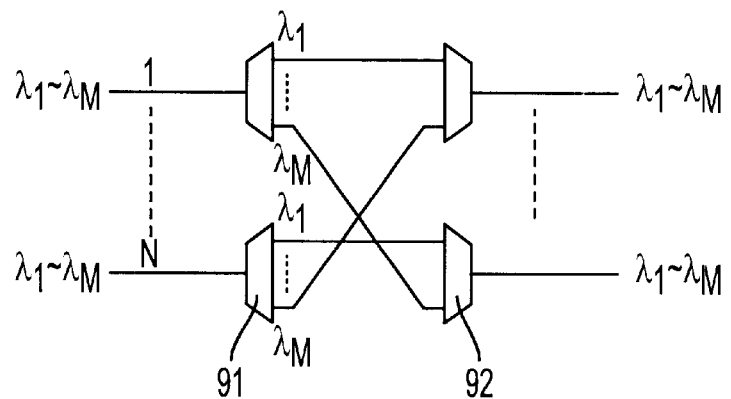
FIG. 9 is a conceptual diagram showing Example 1 of the WDM system of this invention.

An example of a WDM application is shown in FIG. 9. M wavelength signals ($\lambda_1$ to $\lambda_M$) transmitted via N transmission paths (1 to N) are input into a fixed demultiplexer 91 according to their transmission paths. The wavelength signals filtered by the demultiplexer 91 are transferred to a fixed multiplexer 92, again according to their transmission paths. For example, in FIG. 9, switching can be achieved by transferring $\lambda_1$ to the multiplexer (1) among the input signals from the transmission path 1 and transferring $\lambda_M$ to another multiplexer. Individual wavelength signals thus switched are combined via a multiplexer and then output to a transmission path. In such a case, the wavelengths must be considerably precisely controlled; otherwise, crosstalk between adjacent wavelength signals may occur and they may not be transferred to given transmission paths. Using a VCSEL of this invention as a transmitter (not shown) may lead to consistent and precise oscillation with a desired wavelength, allowing a precise communication and eliminating the above problem of crosstalk. Here, an AWG (array waveguide grating) may be available as a demultiplexer and multiplexer.

EXAMPLE 5

Figure 10:
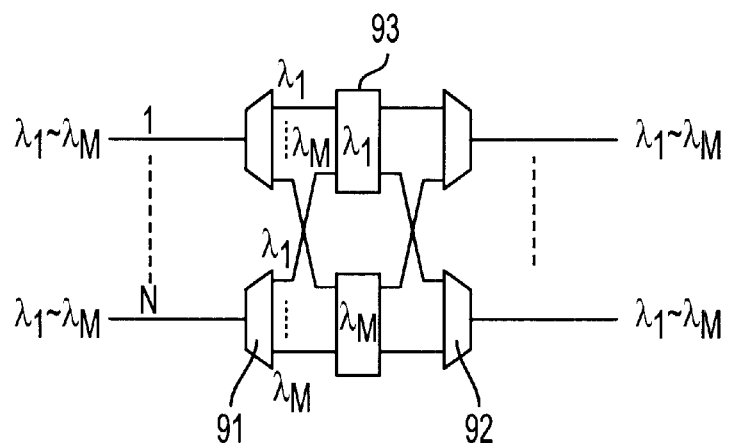
FIG. 10 is a conceptual diagram showing Example 2 of the WDM system of this invention.

FIG. 10 shows another example of a WDM application. In this figure, a wavelength switch 93 corresponding to the number of wavelengths used is inserted between the demultiplexer 91 and the multiplexer 92 in the above example. Individual wavelength signals transmitted from the demultiplexer are collected into respective wavelength switches according to their wavelengths. In this figure, all the signals with a wavelength of $\lambda_1$ filtered by N demultiplexers are collected into the wavelength switch $\lambda_1$. The signals are switched in the wavelength switch to be transferred to a given port of the multiplexer. In this case, a VCSEL of this invention may be used to allow a precise communication as described above. If the wavelength switch used converts a light signal to an electrical signal, it will also be possible to use a VCSEL of this invention as a light source for reconverting the electrical signal to a light signal to be transmitted to a given multiplexer. In such a case, a light with a precisely given wavelength can be transmitted.

EXAMPLE 6

Figure 11:
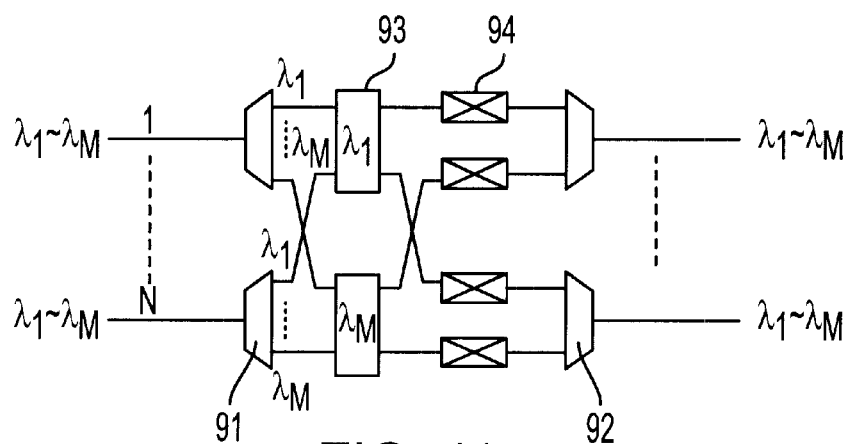
FIG. 11 is a conceptual diagram showing Example 3 of the WDM system of this invention.

The third example of a WDM application has a structure shown in FIG. 11, where a wavelength converter 94 is inserted downstream of the wavelength switch 93 shown in FIG. 10. The wavelength switch 93 is placed for selecting a transmission path for subsequent signal transmission, and the wavelength itself is selected by the wavelength converter 94. It may be effective when the receiving side has a system as shown in FIG. 9 and thus the transmitting side must actively select a transmission wavelength. Furthermore, it has a wavelength variation function, allowing communication with a relatively uncrowded wavelength while monitoring traffic of the transmission paths. As is the above example, the VCSEL of this invention may be used as a light source for a wavelength converter to conduct precise and quite effective wavelength conversion.

While simplex communication has been described in the above examples, duplex communication is, of course, possible if a multiplexer and a demultiplexer are integrated into a MUX/DEMUX device. Furthermore, a required specific rearrangement can be readily understood by those skilled in the art.

What is claimed is:

1. A vertical-cavity surface-emitting laser device comprising:

a surface light-emitting part emitting light at a laser oscillation wavelength, said surface light-emitting part comprising a cavity comprised of two multilayer reflectors and an active layer between the two multilayer reflectors; and a laterally separated waveguide part comprising the active layer, said laterally separated waveguide part configured to introduce induced light into the surface light-emitting part thereby modifying the laser oscillation wavelength.

2. The vertical-cavity surface-emitting laser device as claimed in claim 1, wherein the waveguide part is formed near the surface light-emitting part by a regrowth process, and wherein the waveguide part has an active layer with a different composition from that of the active layer for the surface light-emitting part.

3. The vertical-cavity surface-emitting laser device as claimed in claim 1, where the waveguide part and the surface light-emitting part are separated from each other and mirrors of both edges are formed on the separated edge and the opposite edge of the waveguide part, whereby the waveguide part acts as an edge-emitting laser.

4. The vertical-cavity surface-emitting laser device as claimed in claim 1, wherein the surface light-emitting part comprises a first resonator, and wherein the waveguide part comprises a second resonator.

5. The vertical-cavity surface-emitting laser device as claimed in claim 1, wherein the laterally separated waveguide part introduces the induced light using the active layer to the surface light-emitting part.

* * * * *

UNITED STATES PATENT AND TRADEMARK OFFICE
CERTIFICATE OF CORRECTION

PATENT NO. : 6,687,280 B1
DATED : February 3, 2004
INVENTOR(S) : Mikihiro Kajita It is certified that error appears in the above-identified patent and that said Letters Patent is hereby corrected as shown below:

Column 5,
Line 23, change "$cm^{31\ 2}$" to -- $cm^{-2}$ --.

Column 6,
Line 5, change "$cm^{31\ 3}$" to -- $cm^{-3}$ --.

Column 8,
Line 52, change "$\lambda_I$" to -- $\lambda_1$ --.

Signed and Sealed this

Twenty-first Day of June, 2005

JON W. DUDAS
*Director of the United States Patent and Trademark Office*